(12) United States Patent
Owen et al.

(10) Patent No.: US 7,071,493 B2
(45) Date of Patent: Jul. 4, 2006

(54) HIGH DENSITY LED ARRAY

(75) Inventors: Mark D. Owen, Beaverton, OR (US); Duwayne R. Anderson, Saint Helens, OR (US)

(73) Assignee: Phoseon Technology, Inc., Hillsboro, OR (US)

( * ) Notice: Subject to any disclaimer, the term of this patent is extended or adjusted under 35 U.S.C. 154(b) by 0 days.

(21) Appl. No.: 11/104,954

(22) Filed: Apr. 12, 2005

(65) Prior Publication Data

US 2005/0247947 A1     Nov. 10, 2005

Related U.S. Application Data

(60) Provisional application No. 60/561,771, filed on Apr. 12, 2004.

(51) Int. Cl.
*H01L 33/00*     (2006.01)

(52) U.S. Cl. .............................. 257/88; 257/89; 257/98
(58) Field of Classification Search ................. 257/88, 257/89, 98, 706
See application file for complete search history.

(56) References Cited

U.S. PATENT DOCUMENTS

| | | | |
|---|---|---|---|
| 6,992,335 B1 * | 1/2006 | Ohkawa | 257/98 |
| 2004/0119084 A1 * | 6/2004 | Hsieh et al. | 257/98 |
| 2005/0218468 A1 * | 10/2005 | Owen et al. | 257/433 |
| 2005/0285129 A1 * | 12/2005 | Jackson et al. | 257/98 |

* cited by examiner

Primary Examiner—T. N. Quach
(74) Attorney, Agent, or Firm—Ganz Law, P.C.

(57) ABSTRACT

A dense array of semiconductor devices having an array of micro-reflectors, the micro-reflectors having characteristics that enhance dense packing of the array in balance with collection and collimation of the array's radiant output.

20 Claims, 7 Drawing Sheets

HIGH DENSITY LED ARRAY

RELATED APPLICATIONS

This application claims priority from U.S. Provisional Application Ser. No. 60/561,771, filed Apr. 12, 2004, entitled "COLLIMATION AND DIRECT LIQUID COOLING OF HIGH-DENSITY LED ARRAYS", the contents of which are hereby incorporated by reference, as if recited herein in full, for all purposes.

BACKGROUND OF THE INVENTION

This invention relates to high-density light emitting semiconductor device arrays and, more particularly, to a light emitting diode (LED) array having optical elements directed toward optimizing high-density packing of the LEDs in balance with collection and collimation of the LEDs' radiant output.

Light-emitting semiconductor devices may be arranged in various configurations, such as arrays, for lighting applications. Examples of these applications include: lithographic processes used, e.g., in fabricating semiconductor devices, and curing processes used, e.g., for ink printing and fabrication of DVDs. These applications generally have associated parameters, including, e.g., a photoreaction may contemplate provision of one or more radiant power densities at the work surface, at one or more wavelengths, applied over one or more periods of time and within thermal limitations.

In these applications, the light emitting semiconductor devices generally are employed to deliver against the parameters. At the same time, the light emitting semiconductor devices typically have certain operating characteristics and specifications. The characteristics include: total power emitted; power stability; radiance; radiant intensity; the wavelength(s) of the radiant output; the coherence of the radiant output; the collimation of the radiant output; as well as other operative functionalities provided by the semiconductor device as a light system (e.g., ability to provide pulsed operation and/or effective thermal management). In turn, the light emitting semiconductor device's specifications generally are associated with its fabrication and, among other things, are directed to preclude destruction and/or forestall degradation of the devices. These specifications generally include operating temperatures and applied, electrical power.

Where the application requires delivery of a relatively high radiant power density at or across the work surface, a LED array may have some difficulty in that delivery. That follows because a typical LED in an array has a widely distributed radiant output. Indeed, a typical LED mounted alone on a planar substrate will exhibit a radiant output distributed characteristically across the hemisphere centered at the LED. Given such distribution, only some portion, often relatively small, of that radiant output is directed toward the work surface, thus diminishing the radiant power density at or across the surface. Moreover, such distribution implicates that, as the work surface becomes more physically separated from the LED, the radiant power density at or across the work surface will decrease rapidly, i.e., the decrease generally is anticipated to be proportional to the square of the separation.

Several approaches may be used to achieve radiant power density from a LED array so as to properly perform a particular process. In one example approach, a basic LED array may simply be disposed physically proximate the work surface. However, even if close proximity delivers appropriate power density, this approach generally is undesirable because, e.g., close proximity tends to necessitate undesirable changes to tooling and/or shielding. In another example approach, an array may locate conventional refractive lenses above the LEDs. This approach contemplates that each LED is associated with a conventional lens so that the lens collects and collimates the LED's radiant output. While this approach will tend to increase radiant power density, collecting and collimated a substantial preponderance of any LED's distributed radiant output contemplates a lens having a relatively large diameter, as well as other challenges. While this provides some performance increase, achieving the necessary diameter may be difficult, if not impossible. Moreover, using a lens of such diameter may be at odds with use of a densely-packed LED array and, as such, would be undesirable.

Another example approach to enhancing radiant power density contemplates using conventional reflective optics. In this approach, a LED is mounted in a reflector (e.g., having a parabolic form). Unlike refractive optics, reflective optics generally collect and collimate a substantial portion of the LED's radiant output. Even so, conventional reflective optics generally are not used in a tightly packed or dense array because of their size. For example, a typical application of conventional reflective optics is illustrated by LED flashlights in which one or more LEDs are mounted in a large reflective optic, so that the optic collects light from such LEDs.

Accordingly, there is a need for high-density light emitting semiconductor device array and, more particularly, for LED arrays having optical elements directed toward optimizing high-density packing of the LEDs in balance with collection and collimation of the LEDs' radiant output.

SUMMARY OF THE INVENTION

An array of light emitting semiconductor devices in accordance with the invention includes optical elements selected toward optimizing high-density packing of the devices in the array in balance with collection and collimation of the devices' radiant output.

In an example embodiment in accordance with the invention, an array of LEDs is coupled with a micro-reflector array, which micro-reflector array includes a plurality of micro-reflector elements. Each such micro-reflector element is a parabolic reflector, or otherwise has a basic volumetric form associated with a selected surface of revolution.

Each such micro-reflector element has a lower portion and an upper portion. The upper portion is characterized by a packing edge having a selected perimeter shape. The perimeter shape, if responsive to the volumetric form, will be a circle, because this shape is the outline of any cross-section taken at the upper portion of an element having a volumetric form associated with a surface of revolution. Because circles do not pack as densely as may be desired and because, when packed, circles leave gaps there between, in this example embodiment, each individual element's packing edge preferably has a perimeter shape other than that responsive to the volumetric form. That is, the packing edge preferably has a perimeter shape selected so as to enhance mating with the packing edges of the micro-reflector elements adjacent such individual element in the array and, thereby, among other things, increase the packing density of the LED array. To illustrate, the packing edge typically is a selected polygon, such as a square or a hexagon.

In other example embodiments, the micro-reflector array comprises more than one type of micro-reflector element, the pluralities of each such type of elements typically being arranged in a selected pattern thereamong. An example includes employing one micro-reflector element having a packing edge of one perimeter shape and another micro-reflector element having a packing edge of a second perimeter shape. In this example, various combinations of perimeter shapes may be used without deviating from the principles of the invention, including: (a) one perimeter shape being a circle, with the other being a polygon; (b) both perimeter shapes being circles, but with different radii and (c) both perimeter shapes being polygons, but the polygons being different in type and/or size (e.g., squares and octagons). In this example, as well, off-setting the micro-reflector elements in the array may be employed to enhance packing density. Moreover, in this example, the two elements' volumetric forms typically will be distinct, including: (i) both associated with the same type of surface of revolution (e.g., both parabolic), but having different size; (ii) each being associated with a respective, but different type of surface of revolution (e.g., one parabolic and the other non-parabolic); (iii) one associated with a surface of revolution and the other being a selected polyhedron; and (iv) each being associated with a respective, but different type or size of polyhedron.

These and other embodiments are described in more detail in the following detailed descriptions and the figures.

The foregoing is not intended to be an exhaustive list of embodiments and features of the present invention. Persons skilled in the art are capable of appreciating other embodiments and features from the following detailed description in conjunction with the drawings.

DETAILED DESCRIPTION OF THE INVENTION

Figure 1:
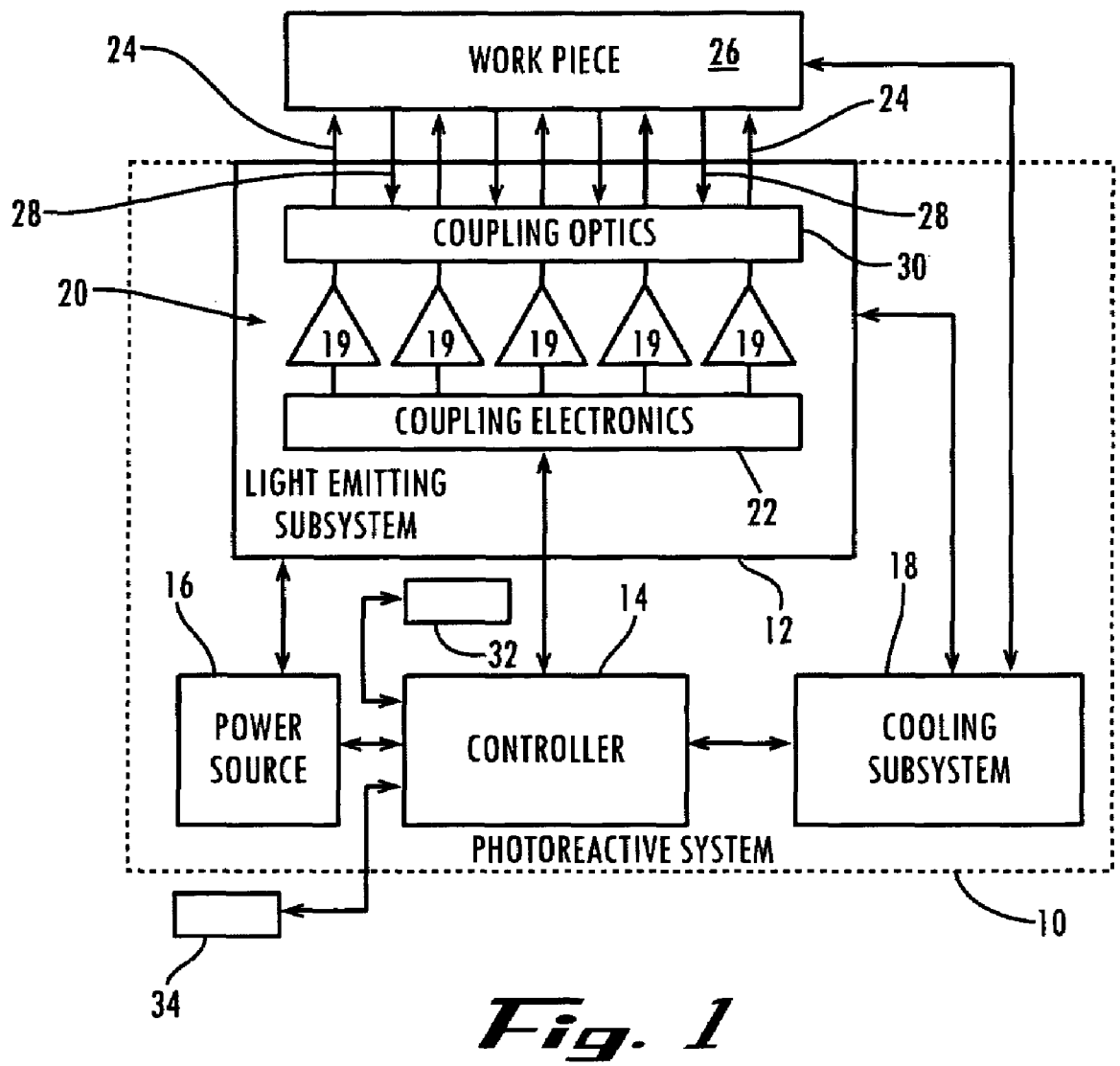
FIG. 1 is a block diagram of a photoreactive system in accordance with the invention.

FIG. 1 is a block diagram of a photoreactive system 10 in accordance with the invention. In this example embodiment, the photoreactive system 10 comprises a light emitting subsystem 12, a controller 14, a power source 16 and a cooling subsystem 18.

The light emitting subsystem 12 preferably comprises a plurality of semiconductor devices 19. The semiconductor devices provide a radiant output 24. The radiant output 24 is directed to a work piece 26. Returned radiation 28 may be directed back to the light emitting system 12 from the work piece 26 (e.g., via reflection of the radiant output 24).

The radiant output 24 preferably is directed to the work piece 26 via coupling optics 30. The coupling optics 30 include a micro-reflector array. In employing such micro-reflector array, each semiconductor device providing radiant output 24 is associated with a respective micro-reflector element on a selected basis. As an example, each micro-reflector element of the array may have one associated LED. As another example, each micro-reflector may have more than one associated LED, e.g., three LEDs, one emitting in the green spectrum, one emitting in the red spectrum and one emitting in the blue spectrum. Use of micro-reflector arrays, including various numbers, arrangements and other relationships of LEDs to micro-reflector elements, so as to enhance radiant output, is shown and described in U.S. patent application Ser. No. 11/084,466, filed Mar. 18, 2005, entitled "MICRO-REFLECTORS ON A SUBSTRATE FOR HIGH-DENSITY LED ARRAY", which application claims priority from U.S. provisional application Ser. No. 60/554,628, filed Mar. 18, 2004, the contents of which are hereby incorporated by reference, as if recited in full herein, for all purposes.

The coupling optics 30 may also include other layers, materials, structure or other elements, any or all of which elements may be variously implemented without departing from the principles of this invention. Such one or more layers, materials or other structure may be interposed between the semiconductor devices 19 and the work piece 26. As an example, the coupling optics 30 may include one or more lenses, or a micro-lens array, disposed between the devices 19 and the work piece 26, so as to enhance collection, condensing, or collimation of one or more device's radiant output and/or to otherwise improve the quality or effective quantity of the radiant output 24 (as well as the radiant power density at or about the work piece 26).

Preferably, each of the layers, materials or other structure of the coupling optics 30 interposed in the path of the radiant output 24 (and/or returned radiation 28) have a selected index of refraction. By properly selecting each index of refraction, reflection at interfaces between layers, materials and other structure may be selectively controlled. As an example, by controlling differences in such indexes at a selected interface disposed between the semiconductor devices 19 and the work piece 26, reflection at that interface may be controlled. Such control could be to reduce the reflection, toward eliminating or, at least, minimizing it, so as to enhance the transmission of radiant output at that interface for ultimate delivery to the work piece 26. Such control could also be to direct or re-direct selected radiation for other predetermined objectives. Control of indexes of refraction so as to enhance radiant output is shown and described in U.S. patent application Ser. No. 11/083,525, filed Mar. 18, 2005, entitled "DIRECT COOLING OF LEDS", which application claims priority from U.S. Provisional Application Ser. No. 60/554,632, filed Mar. 18, 2004, the contents of which are hereby incorporated by reference, as if recited in full herein, for all purposes.

Coupling optics 30 may be employed for various purposes. Example purposes include, among others, to protect the semiconductor devices 19, to retain cooling fluid associated with the cooling subsystem 18, to collect, condense and/or collimate the radiant output 24, to collect, direct or reject returned radiation 28, or for other purposes, alone or in combination. Generally, however, as described further herein, coupling optics 30 in accordance with the invention are employed and implemented so as to enhance packing density of the devices in the array in balance with and while enhancing the effective quality or quantity of the devices' radiant output 24 (e.g., through collection and collimation), particularly as that output is directed to the work piece 26.

Selected of the plurality of semiconductor devices 19 may be coupled to the controller 14 via coupling electronics 22, so as to provide data to the controller 14. As described further below, the controller preferably is also implemented to control such data-providing semiconductor devices, e.g., again via coupling electronics 22. The controller 14 preferably is also connected to, and implemented to control, each of the power source 16 and the cooling subsystem 18. Moreover, the controller 14 preferably receives data from respective such source 16 and subsystem 18.

In addition to the power source 16, cooling subsystem 18 and light emitting subsystem 12, the controller 14 may also be connected to, and implemented to control, elements 32, 34. Element 32, as shown, is internal of the photoreactive system 10. Element 34, as shown, is external of the photoreactive system 10, but is understood to be associated with the work piece 26 (e.g., handling, cooling or other external equipment) or to be active in, or otherwise related to performance of, the photoreaction the system 10 supports.

The data received by the controller 14 from one or more of the power source 16, the cooling subsystem 18, the light emitting subsystem 12, and/or elements 32, 34, may be of various types. As an example the data may be representative of one or more characteristics associated with semiconductor devices 19, respectively. As another example, the data may be representative of one or more characteristics associated with the respective component 12, 16, 18, 32, 34 providing the data. As still another example, the data may be representative of one or more characteristics associated with the work piece 26 (e.g., representative of the radiant power density or spectral component(s) delivered to the work piece). As a further example, the data may be representative of characteristics associated with the photoreaction (e.g., so as to monitor and control the photoreaction's progress, quality, or other indicators). Moreover, the data may be representative of some combination of these characteristics.

The controller 14, in receipt of any such data, preferably is implemented to respond to that data. Preferably, responsive to such data from any such component, the controller 14 is implemented to control one or more of the power source 16, cooling subsystem 18, light emitting subsystem 12 (including one or more such coupled semiconductor devices), and/or the elements 32, 34. As an example, responsive to data from the light emitting subsystem indicating that the radiant power density is insufficient, the controller 14 may be implemented to either (a) increase the power source's supply of power to one or more of the semiconductor devices, (b) increase cooling of the light emitting subsystem via the cooling subsystem 18 (i.e., certain light emitting devices, if cooled, provide greater radiant output), (c) increase the time during which the power is supplied to such devices, or (d) a combination of the above.

The cooling subsystem 18 is implemented to manage the thermal behavior of the light emitting subsystem 12. That is, generally, the cooling subsystem 18 provides for cooling of such subsystem 12 and, more specifically, the semiconductor devices 19. The cooling subsystem 18 may also be implemented to cool the work piece 26 and/or the space between the piece 26 and the photoreactive system 10 (e.g., particularly, the light emitting subsystem 12). Cooling systems providing thermal management in photoreactive systems generally, and providing for direct cooling of light emitting semiconductor devices in particular, are shown and described in U.S. patent application Ser. No. 11/083,525, filed Mar. 18, 2005, previously referenced.

The photoreactive system 10 may be used for various applications. Examples include, without limitation, curing applications ranging from ink printing to the fabrication of DVDs and lithography. Generally, the applications in which the photoreactive system 10 is employed have associated parameters. That is, an application may contemplate parameters such as: provision of one or more levels of radiant power density, at one or more wavelengths, applied over one or more periods of time and within thermal limitations. In these applications, the semiconductor devices 19 generally are employed to deliver against the parameters. However, the semiconductor devices 19 typically have certain operating specifications, which specifications generally are associated with the semiconductor devices' fabrication and, among other things, should be followed in order to preclude destruction and/or forestall degradation of the devices. As well, other components of the system 10 also typically have associated operating specifications. These specifications generally include ranges (e.g., maximum and minimum) for operating temperatures and applied, electrical power. Accordingly, the photoreactive system 10 preferably supports monitoring of the application's parameters. In addition, the photoreactive system 10 preferably provides for monitoring of the semiconductor devices 19, including as to respective characteristics and specifications. Moreover, the photoreactive system 10 preferably also provides for monitoring of selected other components of the system 10, including as to respective characteristics and specifications. Providing such monitoring enables verification of the system's proper operation and, conversely, determination as to whether the system 10 is operating in any way other than properly. Monitoring also supports control of the system's operation, such as to enable and/or enhance the system's proper operation and/or performance of the application (e.g., to balance between the array's radiant output and its operating temperature, so as to preclude heating the array beyond its specifications while also directing radiant energy to the work piece 26 sufficient to properly complete the photoreaction(s) of the application). Such monitoring and control in a photoreactive system is shown and described in U.S. patent application Ser. No. 11/095,210, filed Mar. 30, 2005, entitled "LED ARRAY HAVING ARRAY-BASED LED DETECTORS", which application claims priority from U.S. —Provisional Application Ser. No. 60/558,205, filed Mar. 30, 2004, the contents of which are hereby incorporated by reference, as if recited in full herein, for all purposes.

Generally, it is recognized that some applications may require relatively high radiant power density at or about the work piece, so as to properly perform the application. Accordingly, it is desirable to implement a light emitting subsystem 12 that can deliver such power density. To do so, the subsystem 12 preferably is implemented using a dense array of light emitting semiconductor devices 19. In particular, the subsystem 12 preferably is implemented using a high-density, light emitting diode (LED) array. As previously described, the LED array preferably is associated with coupling optics 30 in the form of a micro-reflector array. A high-density LED array is shown and described in U.S. patent application Ser. No. 10/984,589, filed Nov. 8, 2004, the contents of which are hereby incorporated by reference, as if recited in full herein, for all purposes. Moreover, a high-density array having a micro-reflector array is shown and described in U.S. patent application Ser. No. 11/084, 466, filed Mar. 18, 2005, previously referenced. Although LED arrays may be used and are described in detail herein, it is understood that the semiconductor devices 19, and array(s) 20 of same, may be implemented using other light emitting technologies without departing from the principles of the invention, which technologies include, without limitation, organic LEDs, laser diodes, and other semiconductor lasers.

Figure 2:
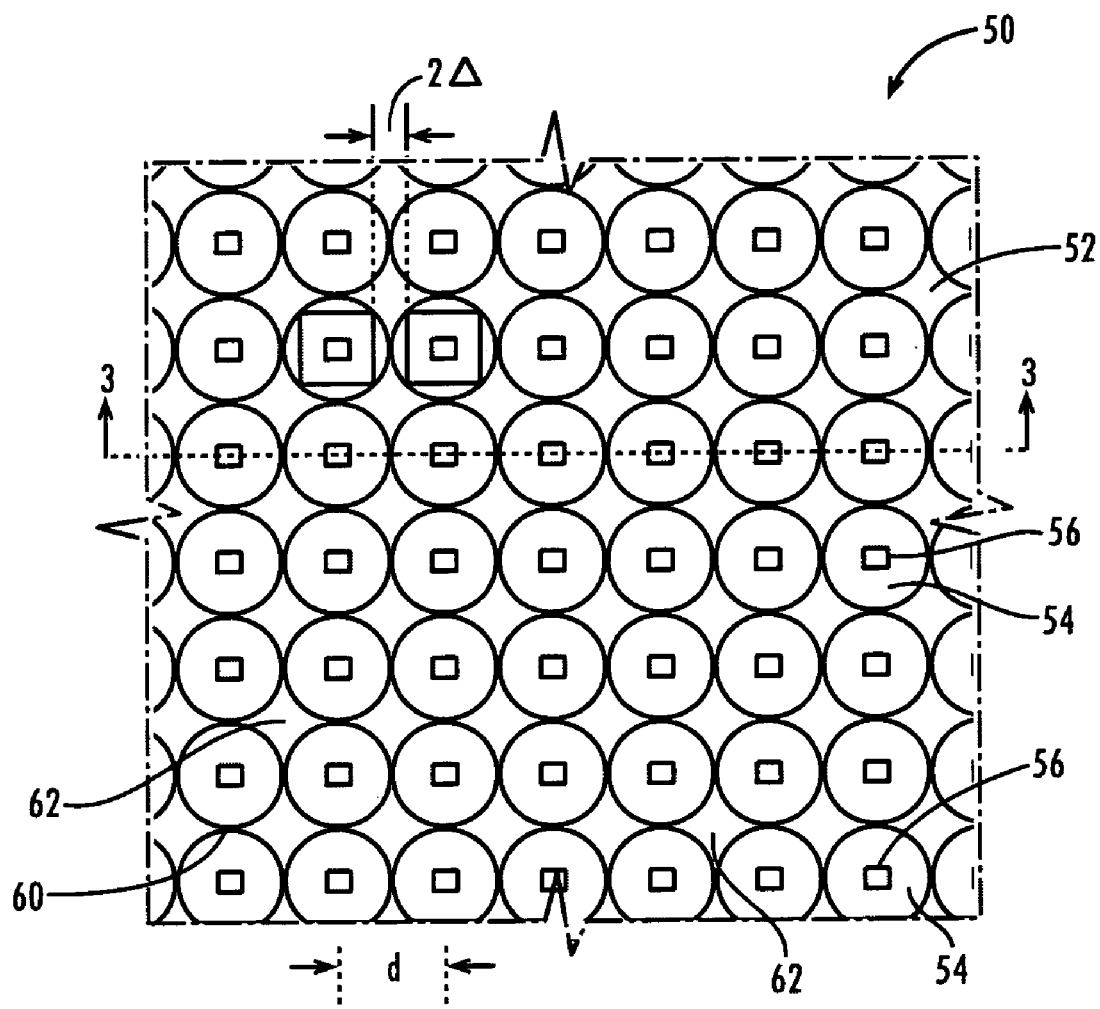
FIG. 2 is a top view of a portion of a dense LED array.

FIG. 2 is a top view of a portion of a dense LED array 50 as shown and described in the documents previously incorporated by reference. Although this array 50 omits certain aspects of the invention, it is described with reference to FIGS. 2 and 3 because it serves to illustrate aspects of, or relevant to, the invention.

Array 50 is provided in a substrate 52 having a plurality of micro-reflector elements 54 formed therein. A LED 56 is provided within each micro-reflector element 54. Although only one LED is shown associated with a micro-reflector element 54, it is understood, as previously described, that each micro-reflector element 54 may be associated with more than one LED without departing from the principles of the invention.

In this array 50, each of the micro-reflector elements 54 typically is an opening in the substrate 52, the opening being void or substantially void and having a selected volume and volumetric form, so as to accommodate the associated one or more LEDs. Although the elements 54 are shown implemented as openings in a substrate, it is understood that the elements 54 may be otherwise implemented without departing from the principles of the invention, including, e.g., being formed in a layer or other material disposed on top of the substrate or being formed in a combination of such layer or other material together with a substrate having openings. The substrate, layer and other materials may be any of a variety of materials, without departing from the principles of the invention.

The micro-reflector elements 54 may be implemented using various technologies. As examples, the micro-reflector elements may be formed using lithographical technology, machining, stamping, casting, forging, or other processes, or combinations of one or more of these. To illustrate, micro-reflector elements 54 may be formed by etching, so as to provide truncated, inverted, square pyramidal forms. To further illustrate, micro-reflector elements 54 may be formed by machining openings (e.g., via lasers and/or plasma). To illustrate still further, micro-reflector elements 54 may be formed by stamping parabolic forms in copper or other suitable material. To yet further illustrate, micro-reflector elements 54 may also be formed by a combination of etching, together with machining or other technology. In this further illustration, a substrate is etched to form openings. Each opening is then machined to provide desired shape or shapes.

Figure 3:
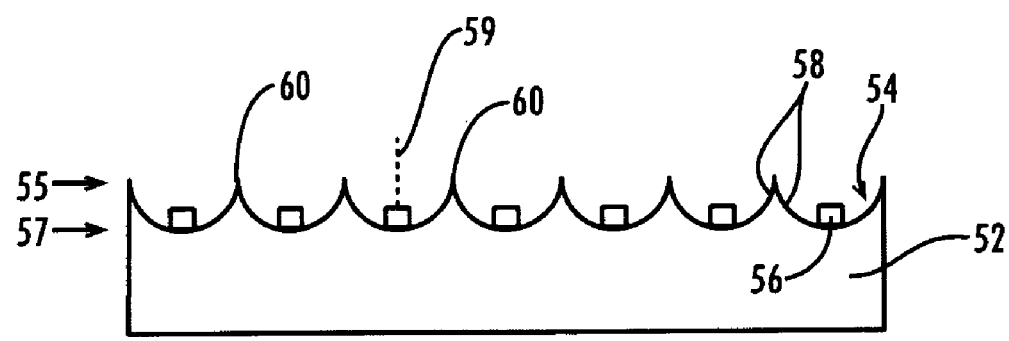
FIG. 3 shows a side view of the LED array of FIG. 2, taken along line 3—3.

FIG. 3 shows a side view of the LED array of FIG. 2, taken along line 3—3. Each micro-reflector element 54 includes one or more reflective surfaces 58. These reflective surface(s) 58 preferably are implemented so as to reflect one or more selected spectra of the radiant output(s) of the respective LEDs 56 of the array 50. The reflective surface(s) 58 may be implemented using various processes, including, as non-exhaustive examples, via selected metal or other coatings.

In this LED array, each such micro-reflector element 54 also has a basic volumetric form. The basic volumetric form is the shape that provides the basis for the collection and collimation of the radiant output of the LEDs 56. Here, the basic volumetric form correlates to a surface of revolution and, in particular, is illustrated as a hemispherical form.

In turn, each such micro-reflector element 54 has an upper portion 55, a lower portion 57 and a longitudinal axis 59 there between. Each element 54 has a packing edge 60 disposed at the top of the upper portion 55. The packing edge 60 has a selected perimeter shape, the perimeter shape enclosing an area. The edge's perimeter shape is understood to contribute to the packing capabilities of the micro-reflector elements 54 in forming the array 50.

As shown, the edge's perimeter shape is a circle. The perimeter shape is such because it is responsive to the volumetric form which is maintained in this micro-reflector element. Indeed, the perimeter shape will be a circle whenever the element maintains the volumetric form to the upper portion, because a circle is the outline of any cross-section of any volumetric form correlative to a surface of revolution.

With circular perimeter shapes for the edges of all micro-reflector elements 54, the array 50 provides for packing of LEDs 56 densely, but with some characteristics that provide avenues for enhancement. As an example, packing based on circular perimeter shapes leads to gaps 62 between the micro-reflector elements 54, in which gaps no LED is present to provide radiant output and no micro-reflector element collects or collimates. In addition, the packing is dense, but less dense than is possible, e.g., with micro-reflective elements having packing edges of non-circular perimeter shapes.

Because circles do not pack as densely as may be desired and because, when packed, circles leave gaps there between, example embodiments of a LED array in accordance with the invention tend to have at least one type of micro-reflector element characterized by a packing edge having a perimeter shape other than that responsive to the volumetric form, particularly if the volumetric form correlates to a surface of revolution. More generally, the packing edges of the micro-reflector array have one or more perimeter shapes selected so as to enhance mating among packing edges across the micro-reflector elements so as to enhance the packing density of the LED array in balance with collection and collimation of the emitting semiconductor devices' radiant output.

Figure 4:
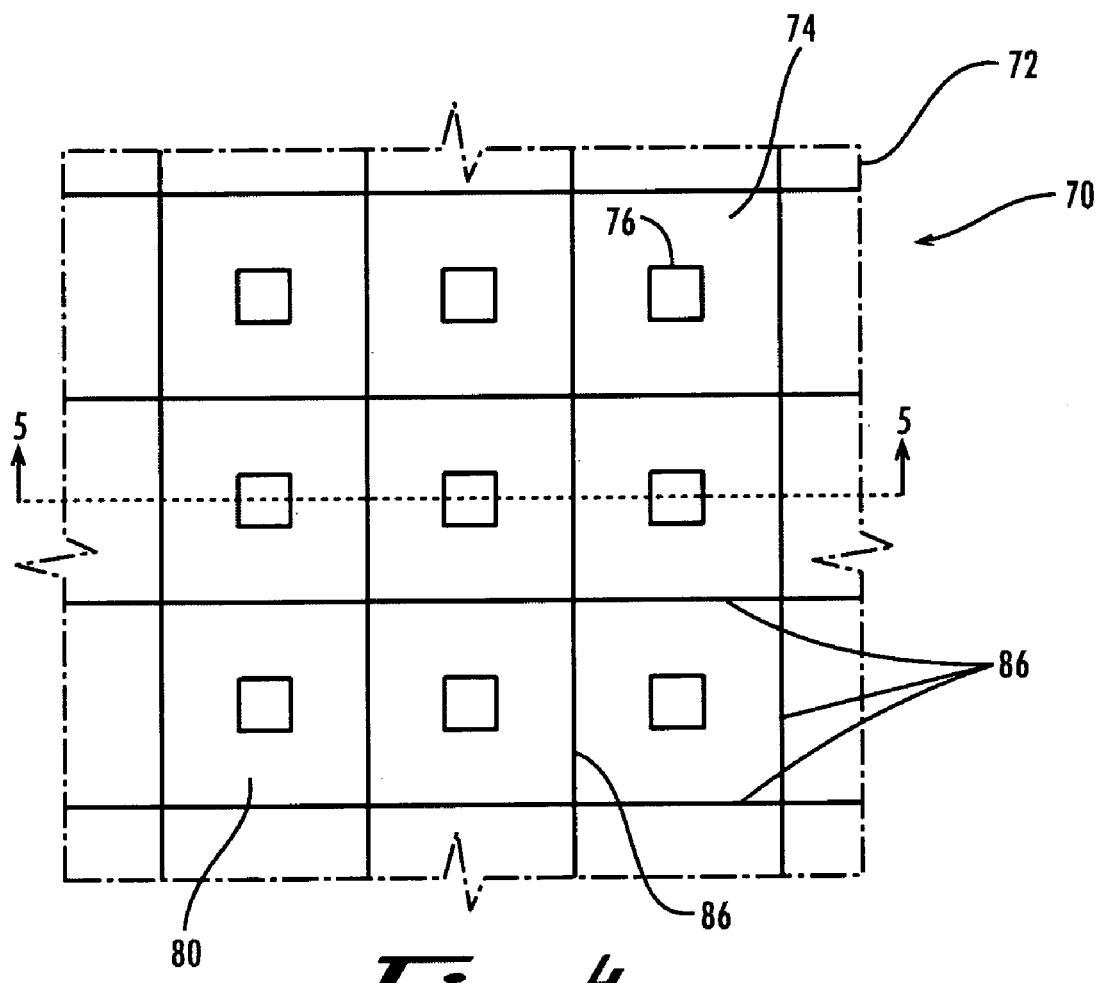
FIG. 4 is a top view of a portion of a dense LED array, in accordance with the invention.

Turning to FIG. 4, a top view is shown of a portion of a dense LED array 70, in accordance with the invention. Array 70 is provided in a substrate 72 having a plurality of micro-reflector elements 74 formed therein, such formation and implementation thereof being as previously described. A LED 76 is provided within each micro-reflector element 74. Again, although only one LED is shown associated with a micro-reflector element 74, it is understood, as previously described, that each micro-reflector element 74 may be associated with more than one LED 76, without departing from the principles of the invention.

Figure 5:
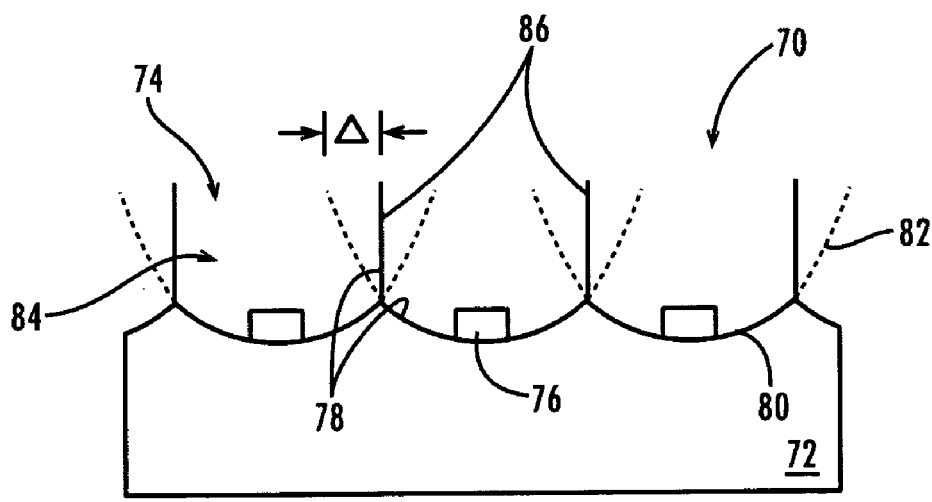
FIG. 5 shows a side view of the LED array of FIG. 2, taken along line 5—5.

Turning to FIG. 5, a side view is shown of the LED array 70 of FIG. 4, taken along line 5—5. Each micro-reflector element 74 includes one or more reflective surfaces 78. These reflective surface(s) 78 preferably are implemented so as to reflect one or more selected spectra of the radiant output(s) of the respective LEDs 76. The reflective surface(s) 78 may be implemented using various processes, including, as non-exhaustive examples, via selected metal or other coatings.

In this LED array 70, each such micro-reflector element 74 has a basic volumetric form. As previously described, the basic volumetric form provides the basis for the collection and collimation of the radiant output of the LEDs 76. Here, the basic volumetric form correlates to a volume resulting from a surface of revolution and, as in FIGS. 2 and 3, is hemispherical. The hemispherical form of the element 74 is illustrated via the element's lower portion 80, together with phantom lines 82. The phantom lines 82 indicate that, as is described below and unlike as in FIGS. 2 and 3, the micro-reflector element 74 does not maintain the basic volumetric form. Rather a selected upper portion 84 of the element 74 follows a volumetric form or forms transitioning (here immediately, but in other embodiments, step-wise or smoothly) from the basic volumetric form so as to provide for the perimeter shape of the element's packing edge 86.

Each micro-reflector element 74 has a packing edge 86. The packing edge 86 has a selected perimeter shape. As previously described, the perimeter shape is understood to contribute to the packing capabilities of the micro-reflector elements 74 in forming the array 70. As shown, the edge's perimeter shape is a square (i.e., rather than the circle of FIGS. 2 and 3).

Because of the edge's square perimeter shape, the elements of micro-reflector array 70 of FIGS. 4 and 5 tend to mate along their adjacent edges (e.g., like tiles), thereby substantially eliminating the gaps 62 that are shown in FIGS. 2 and 3. Moreover, the micro-reflector elements 74 pack more closely center-to-center, so that the array 70 is more dense than the array 50 of FIGS. 2 and 3. As to the packing density, an illustrative comparison is shown in the FIGS. 2–5: for the array 50 of FIGS. 2 and 3, the distance between LEDs 56 center-to-center is "d", "d" being equivalent to the hemisphere's diameter, whereas, for the array 70 of FIGS. 4 and 5, the distance between LEDs is "d-2Δ" where "d" is again the hemisphere's diameter and "Δ" is the lateral overlap of the element's hemisphere relative to each adjacent hemisphere.

Figure 6:
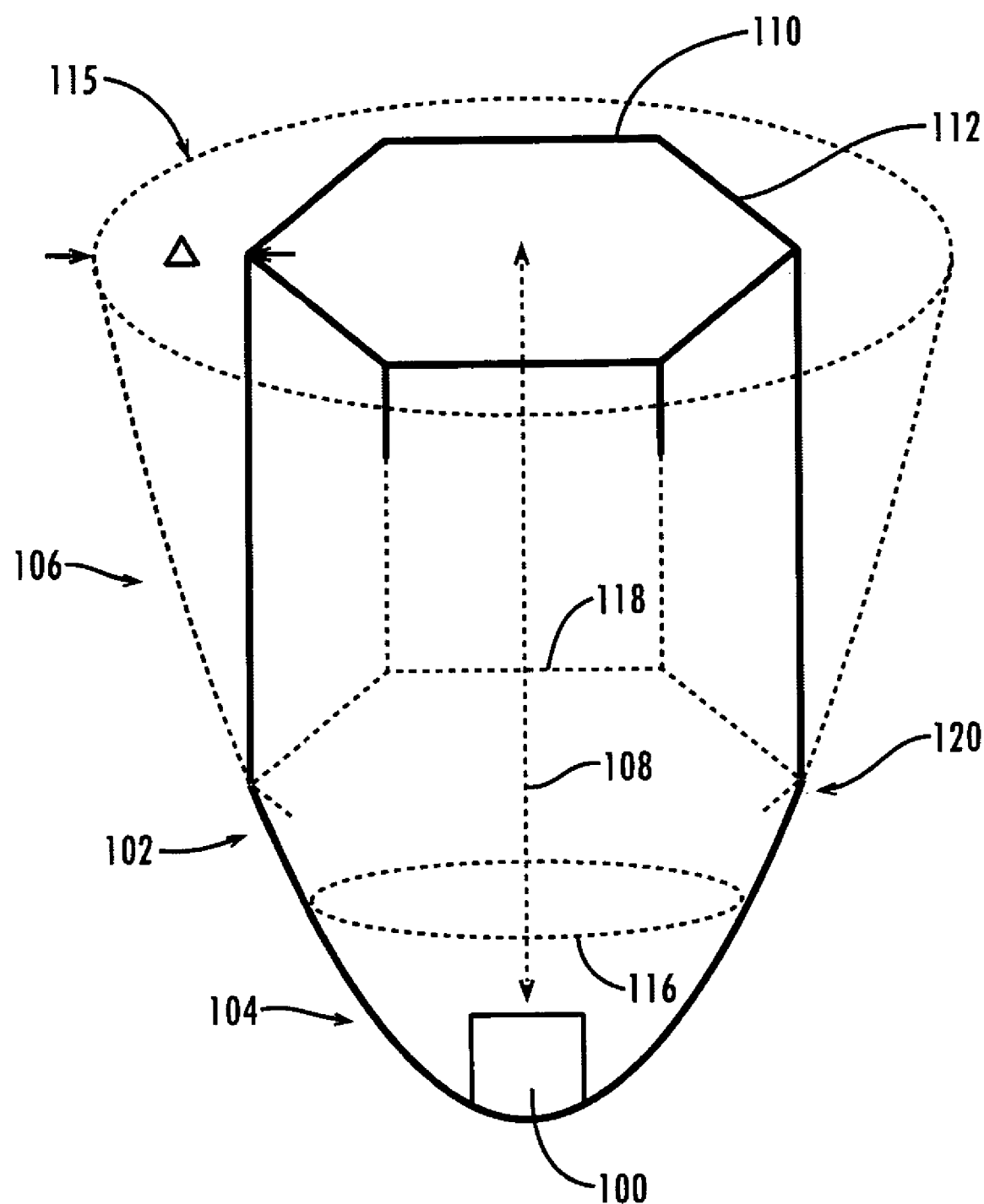
FIG. 6 shows an example embodiment in accordance with the invention.
Figure 7A:
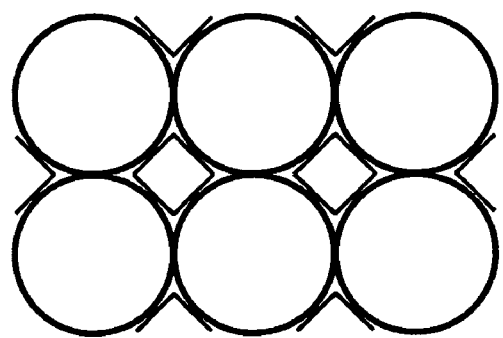
FIG. 7 shows examples of perimeter shapes and patterns, in accordance with the invention.
Figure 7B:
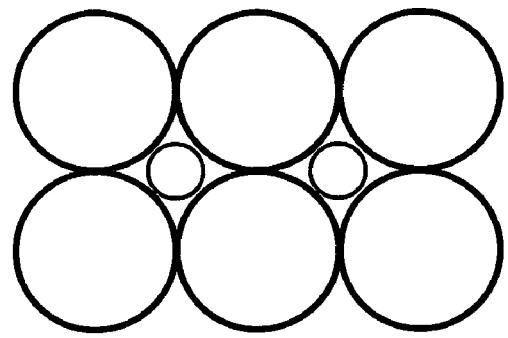
Figure 7C:
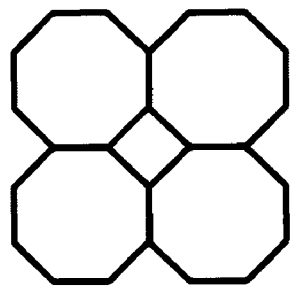
Figure 7D:
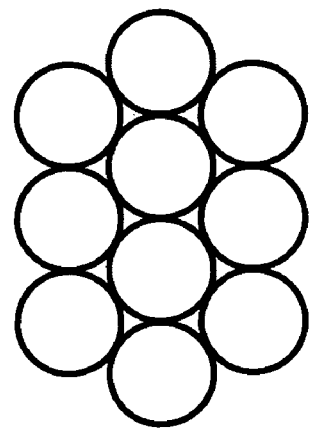
Figure 7E:
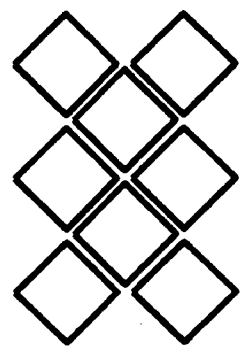

In this illustration, it is understood that the "Δ" may vary depending on the selected area enclosed by the packing edge relative to the projected area of the opening at the upper portion of the micro-reflector were the micro-reflector to maintain the basic volumetric form. This is illustrated in FIG. 6 in that the "Δ" between the projected area of the parabolic form at the upper portion 106, as delineated by phantom lines 115, will vary depending on the type and size of the perimeter shape 112 of the packing edge 110. As examples, "Δ", and thus packing density, will generally be inversely proportional to changes in the size of hexagonal perimeter shape.

To further illustrate increased packing density via selection of a square packing edge as shown in FIGS. 4–5, two representative reflector elements 74 having square perimeter shapes are depicted in FIG. 2, together with an indication of the magnitude of 2Δ relative to the cross-sectional area of the upper portion 55 of micro-reflector element 54.

Figure 9:
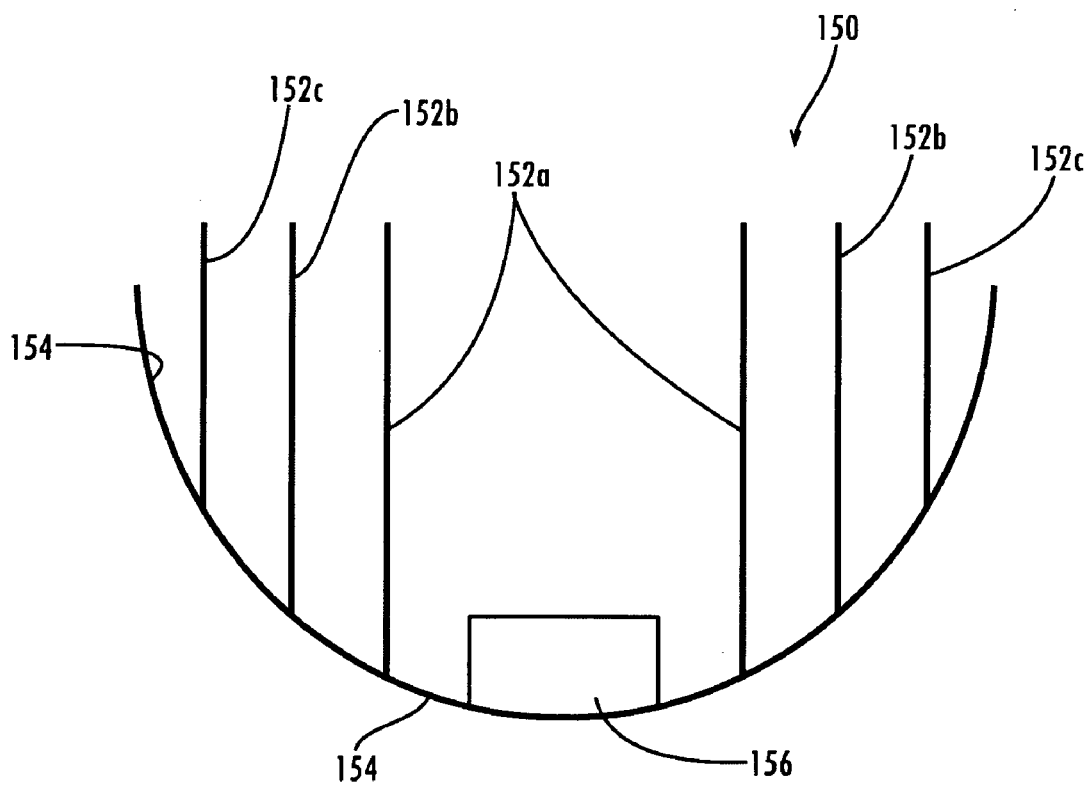
FIG. 9 shows a micro-reflector element, depicting change in volumetric form associated with various perimeter shapes, in accordance with the invention.

While selecting a packing edge may result in denser packing, it is understood generally to result in an optical cost. As an example, that selection may reduce collimation of the radiant output of the LEDs 76 and, as such, potential reduction of radiant power density at or about the work piece 26. This is illustrated in FIG. 9, wherein a micro-reflector element 150 is shown, together with changes in volumetric form associated with various packing edge perimeter shapes 152a, 152b, 152c. The element 150 has reflective surfaces 154, which surfaces are implemented so as to collect and collimate the radiant output of a particular light emitting semiconductor 156. However, regardless of the type of perimeter shape, shapes 152a, 152b and 152c indicate that, as the perimeter shape's size decreases (152c>152b>152a) relative to the volumetric form, less and less of the surfaces 154 remain to collect and collimate. To address this optical cost, as previously described, additional coupling optics 30, such as a microlens array disposed between the array 70 and the work piece 26, may be employed. More generally, though, as a central aspect of the invention, such selection of the type and size of the perimeter shape(s) of a micro-reflector array—as well as, and in conjunction with, selection of other coupling optics, the volumetric form(s), the number, size, types and performance (e.g., near field radiation pattern) of LEDs deployed in each micro-reflector element, and the transition from the basic volumetric form to the perimeter shape—is directed toward optimizing high-density packing of the emitting semiconductor devices in the array in balance with collection and collimation of the devices' radiant output.

Turning back to FIG. 6, an example embodiment is shown of one LED 100 in a micro-reflector element 102, in accordance with the invention. Here, the LED 100 is understood to be part of an LED array, the LED array being coupled with an micro-reflector array, which micro-reflector array includes a plurality of micro-reflector elements substantially the same as micro-reflector element 102.

The micro-reflector element 102 has a lower portion 104 and an upper portion 106, and a longitudinal axis 108 oriented and extending therebetween. Such micro-reflector element 102 is a parabolic reflector; that is, the element 102 has a basic volumetric form correlating to a surface of revolution that forms a parabolic volume. The micro-reflector element's lower portion 104 generally has disposed thereat the LED 100. However, as previously stated, a plurality of LEDs may be associated with the element 102 and, in that case, generally will be disposed at or about the lower portion 104.

The micro-reflector element's upper portion 106 is characterized by a packing edge 110. The packing edge 110 has a selected perimeter shape 112, here a hexagon. In this example embodiment, this element's packing edge 110 has a perimeter shape 112 selected so as to enhance mating with the packing edges of the other micro-reflector elements (not shown) that are adjacent to this element in the array and decrease the separation, center-to-center, of the LEDs in the array. The perimeter shape preferably is also selected in contemplation of the effect such shape has on the collection and collimation of the radiant output of the LED (particularly, as such shape alters the micro-reflector's volumetric form. Thereby, packing density of the LED array is enhanced in balance with the collection and collimation of the radiant output so as to optimize performance of the array, particularly in the context of the photoreactive application for which it is being employed.

While this example embodiment suggests that the micro-reflector array provides a common packing edge 110 for all its micro-reflector elements 102 (e.g., hexagons of the same size), it is understood that the array may be otherwise configured. That is, the micro-reflector array may be implemented to employ one micro-reflector element 102 having a packing edge 110 of one perimeter shape 112 and at least one other micro-reflector element having a packing edge 110 of a second perimeter shape 112. In this example and other embodiments, various combinations of perimeter shapes may be used without deviating from the principles of the invention, including: (a) one perimeter shape being a circle, with the other being a polygon; (b) both perimeter shapes being circles, but with different radii; and (c) both perimeter shapes being polygons, but the polygons being of different types and/or sizes (e.g., squares and octagons). In such example embodiments where the micro-reflector array includes more than one type of micro-reflector element, the pluralities of each such type of elements typically are arranged in a selected pattern thereamong. Such patterns may employ off-sets among elements in order to enhance packing density Examples of these perimeter shapes and patterns, including use of off-sets, are shown in FIG. 7.

Moreover, in such example embodiments where two types of micro-reflector elements having different packing edges, such elements will also typically have distinct volumetric forms. Examples of various volumetric forms include: (i) both elements correlating to the same type of surface of revolution (e.g., both parabolic), but having different size; (ii) each element correlating to a respective, but different type of surface of revolution (e.g., one parabolic and the other non-parabolic); (iii) one element correlating to a surface of revolution and the other being a selected polyhedron; and (iv) each element being associated with a respective, but different type and/or size of polyhedron. Any such form may be truncated at either/both the bottom or/and the top.

Turning back to FIG. 6, in order to provide a packing edge 110 of any such selected perimeter shape 112, the micro-reflector element 102 is fabricated so as to selectively transition in form along the longitudinal axis 108, at some point or range, between the elements' lower and upper portions 104, 106. In that transition, the cross-section of the element 102 changes from the circles 116 given by the basic volumetric form (here, the parabolic form) to the polygons 118 given by the packing edge 110 (here, hexagons).

In FIG. 6, the transition is indicated by the circle 116, in phantom lines, disposed in the lower portion 104 and by a portion of a hexagon 118, in phantom lines, disposed at a transition portion 120 of the element 102. The transition portion 120 is understood to include the range along the longitudinal axis 108, starting at initiation of the transition from the cross-section of the basic volumetric form and ending where the cross-section of the element 102 becomes the perimeter shape 112. Here, the transition portion 120 is effectively a point along the longitudinal axis 108. That is, the transition is immediate, in that the perimeter shape 112 is established and unchanged from the upper portion 106 toward the lower portion 104, until its intersection with the basic volumetric form.

As in FIG. 6, transition may be accomplished by providing the exact, unchanged perimeter shape 112 of the packing edge 110 from the upper portion 106, toward the lower portion 104, until the perimeter shape 112 intersects the basic volumetric form. Doing so, effects an immediate transition at that intersection. However, in the alternative, the transition may also be accomplished by providing one or more intermediate cross-sectional shapes (e.g., in the transition portion, having neither the circle(s) of the basic volumetric form or the exact perimeter shape of the packing edge). This alternative effects a smooth or stepped transition along the longitudinal axis.

Figure 8:
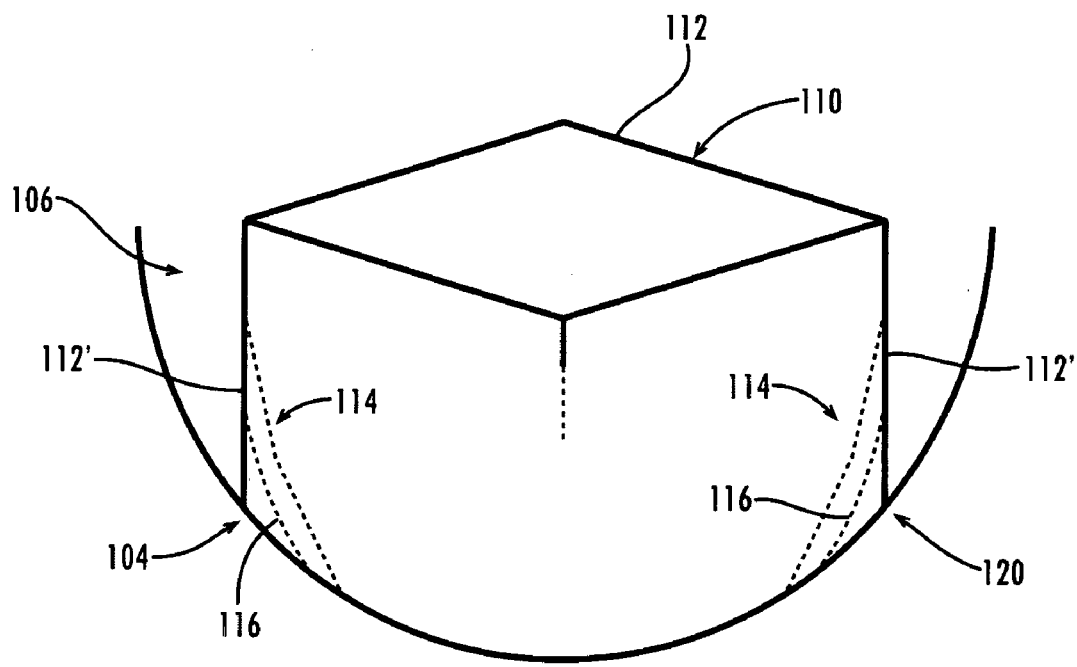
FIG. 8 shows examples of smooth and stepped transitions in micro-reflector elements, in accordance with the invention.

Examples of smooth and stepped transitions are shown in FIG. 8. In FIG. 8, for illustration, the basic volumetric form is hemispheric and the packing edge's perimeter shape is square. Again, an immediate transition is depicted by reference lines 112'. These lines 112' represent that the perimeter shape 112 is established and unchanged from the upper portion 106 toward the lower portion 104, until the transition portion 120 is established by intersection of the perimeter shape with the basic volumetric form. In the alternative, the perimeter shape is projected toward the lower portion, whereupon one or more cross-sections are used in transition between the perimeter shape (e.g., polygon) and the basic volumetric form's circles. More specifically, phantom lines 114 show a stepped transition, as the perimeter shape is replaced by a cross-sectional shape providing two successively less-steep pitches before intersection with the basic volumetric shape. In turn, phantom lines 116 show a smooth transition, as the perimeter shape is replaced by a cross-sectional shape providing a continuously-curved line before intersection with the basic volumetric shape.

Figure 10:
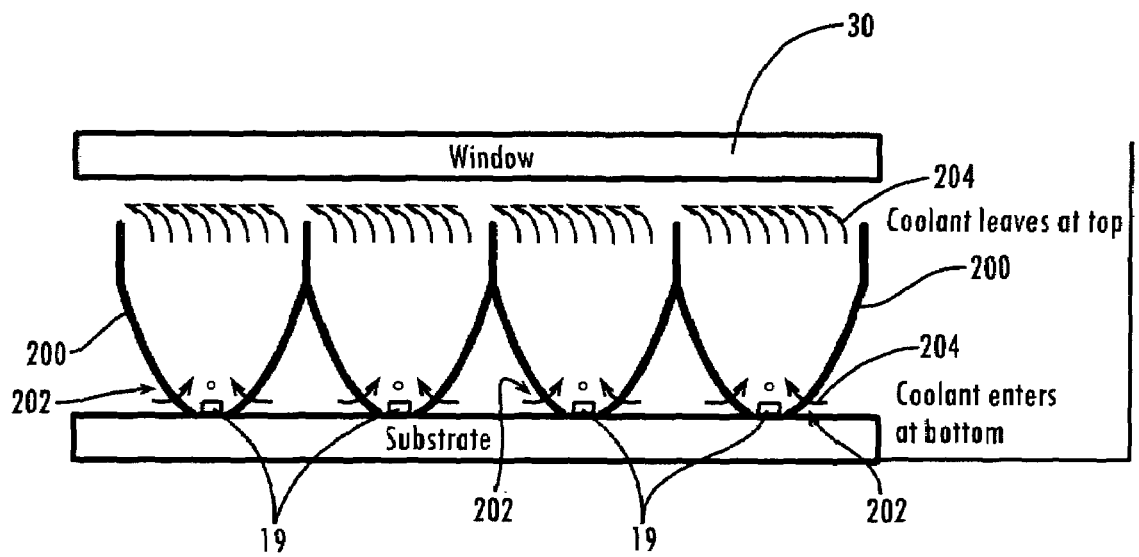
FIG. 10 shows a first approach for direct cooling an array, in accordance with the invention.
Figure 11:
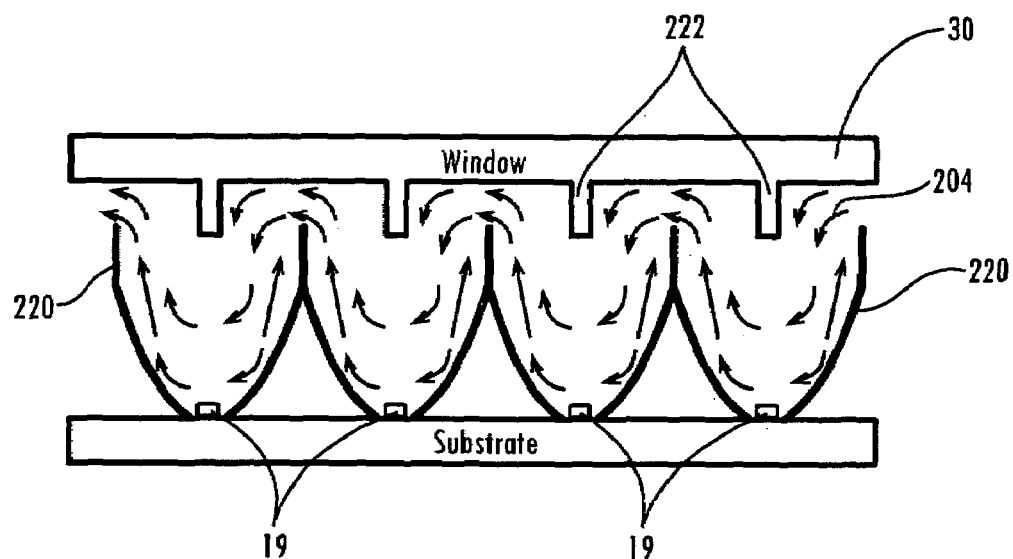
FIG. 11 shows a second approach for direct cooling an array, in accordance with the invention.

Turning to FIGS. 10 and 11, two approaches are depicted relating to direct cooling of LEDs and/or other semiconductor devices used in a dense array, according to the invention. The array preferably comprises part of light emitting subsystem 12 of photoreactive system 10, as previously described and shown in FIG. 1. Moreover, the photoreactive system 10 includes cooling subsystem 18, implemented to manage the thermal behavior of the light emitting subsystem 12. Preferably, the cooling subsystem 18 provides direct cooling of the semiconductor devices, in accordance with the disclosures shown and described in U.S. patent application Ser. No. 11/083,525, filed Mar. 18, 2005, previously referenced.

In FIG. 10, micro-reflector elements 200 include slots 202 disposed in the elements' respective lower portions. Coolant 204 is provided so as to enter through respective slots 202. Preferably, slots 202 are positioned below the focal point, which typically is the location of the semiconductor device 19. Coolant 204 flows through the slots (either by pressurization, convection, or otherwise, or both) and exits from the top of the elements 200. Coupling optics 30 preferably are employed, in part, to contain the coolant 204.

In FIG. 11, semiconductor devices 19 are disposed in an array of micro-reflector elements 220. Coupling optics 30 is implemented having deflectors 222. Typically, these deflectors 222, like the coupling optics 30, have a selected index of refraction so as to minimize reflection of the radiant output (i.e., maximizing transmission to the work piece 26). Here, one or more deflectors 222 are implemented having a selected shape, length and volume, and are disposed toward each device 19 and element 220. Preferably, at least one such deflector 222 is centered, or substantially centered, on the respective element 220 (e.g., is aligned with the longitudinal axis of the element, as such axis is previously described for example embodiments). The deflector 222, so implemented and disposed, divert a selected portion of the coolant 204 so as to flow into the respective element 220. Such diversion will tend to cause turbulence in the coolant (e.g., swirling around), which together with direct contact, cools the device 19. Although turbulence is indicated here, use of turbulence generally contemplates a balancing of its benefits (e.g., enhanced cooling performance) against its detriments.

Persons skilled in the art will recognize that many modifications and variations are possible in the details, materials, and arrangements of the parts and actions which have been described and illustrated in order to explain the nature of this invention and that such modifications and variations do not depart from the spirit and scope of the teachings and claims contained therein.

What is claimed:

1. A dense array of light emitting semiconductor devices, the array providing radiant output directed to a work piece, the array comprising: a plurality of first micro-reflector elements, each such element having an upper portion, a lower portion and a transition portion disposed between the upper and lower portions, each such element including a packing edge disposed in the upper portion, the packing edge having a perimeter shape, each such element having a basic volumetric form, the cross-section of which volumetric form has a outline that differs from the perimeter shape of the packing edge and wherein, in the transition portion, the cross-section of the volumetric form transitions to provide for the perimeter shape.

2. The dense array of claim 1, wherein at least one such micro-reflector element has one associated light emitting semiconductor device.

3. The dense array of claim 1, wherein at least one such micro-reflector element has a plurality of associated light emitting semiconductor devices.

4. The dense array of claim 1, wherein at least one such micro-reflector element has three light emitting diodes, one such diode emitting in the red spectrum, one emitting in the green spectrum and one emitting in the blue spectrum.

5. The dense array of claim 1, further comprising coupling optics interposed between the semiconductor devices and the work piece.

6. The dense array of claim 5, wherein the coupling optics comprise a lens structure.

7. The dense array of claim 1, wherein the basic volumetric form correlates to a surface of revolution.

8. The dense array of claim 7, wherein the volumetric form comprises at least one of a parabolic form, a hemispherical form and a conic form.

9. The dense array of claim 7, wherein the volumetric form is truncated in one or both of the lower or upper portions of the element.

10. The dense array of claim 1, wherein the basic volumetric form correlates to a polyhedron.

11. The dense array of claim 1, wherein the transition portion exhibits an immediate, smooth or stepped transition.

12. The dense array of claim 11, wherein, at the interface between the transition portion and the upper portion, the cross-section of the element has an outline congruent to the perimeter shape of the packing edge.

13. The dense array of claim 1, further comprising a plurality of second micro-reflector elements, each such second micro-reflector element having an upper portion, a lower portion and a transition portion disposed between the upper and lower portions, each such second micro-reflector element including a packing edge disposed in the upper portion, the packing edge having a perimeter shape, each such second micro-reflector element having a basic volumetric form, the cross-section of which volumetric form has a outline that differs from the perimeter shape of the packing edge and wherein, in the transition portion, the cross-section of the volumetric form transitions to provide for the perimeter shape and, wherein the perimeter shape of the plurality of second micro-reflector elements differs from the perimeter shape of the plurality of first micro-reflector elements.

14. The dense array of claim 13, wherein the volumetric form of the plurality of second micro-reflector elements differs from the volumetric form of the plurality of first micro-reflector elements.

15. The dense array of claim 13, wherein the first and second micro-reflector elements are arranged in a pattern thereamong.

16. The dense array of claim 1, wherein the perimeter shape is a polygon.

17. The dense array of claim 1, wherein the perimeter shape is a selected type and size, such selection responding to the selection of one or more of additional coupling optics, one or more volumetric forms, the number, size, type of one or more semiconductor devices, the near field radiation pattern of one or more semiconductor devices and the cross-sections of the element in the transition portion, whereby the packing of the array is enhanced in balance with collection and collimation of the radiant output.

18. The dense array of claim 1, wherein the micro-reflector element includes slots disposed in the lower portion, through which slots coolant flows to directly cool the semiconductor devices.

19. The dense array of claim 1, wherein the semiconductor device comprises LEDs and each micro-reflector element has associated therewith one or a group of LEDs, which one or group of LEDs are individually or collectively collimated by the micro-reflector element, in which the collimating optical component is reflective and has a reflective surface, which in shape and reflectivity is optimized in relation to the near field emission pattern of the LEDs being collimated.

20. A photoreactive system, the system providing radiant output directed to a work piece in association with a photoreaction, the system comprising: a light emitting subsystem, the light emitting subsystem including a dense array of light emitting semiconductor devices, the array having a plurality of micro-reflector elements, each such element having an upper portion, a lower portion and a transition portion disposed between the upper and lower portions, each such element including a packing edge disposed in the upper portion, the packing edge having a perimeter shape, each such element having a basic volumetric form, the cross-section of which volumetric form has a outline that differs from the perimeter shape of the packing edge and wherein, in the transition portion, the cross-section of the volumetric form transitions to provide for the perimeter shape.

* * * * *